(12) United States Patent
Denzler et al.

(10) Patent No.: US 7,218,037 B2
(45) Date of Patent: May 15, 2007

(54) METHOD FOR IMPROVING THE LONG-TERM STABILITY OF A PIEZOELECTRIC ACTUATOR AND A PIEZOELECTRIC ACTUATOR

(75) Inventors: Michael Denzler, Regensburg (DE); Stefan Kohn, Hohenburg (DE); Martin Neumaier, Regensburg (DE); Roland Niefanger, Regensburg (DE); Klaus Plecher, Zeitlarn (DE); Andreas Voigt, Burglengenfeld (DE); Claus Zumstrull, Regenstauf (DE)

(73) Assignee: Siemens Aktiengesellschaft, Munich (DE)

( * ) Notice: Subject to any disclaimer, the term of this patent is extended or adjusted under 35 U.S.C. 154(b) by 85 days.

(21) Appl. No.: 11/189,334

(22) Filed: Jul. 26, 2005

(65) Prior Publication Data

US 2007/0024160 A1 Feb. 1, 2007

(51) Int. Cl.
*H01L 41/053* (2006.01)
(52) U.S. Cl. .................. 310/348; 310/344; 310/348
(58) Field of Classification Search ............... 310/340, 310/344, 348, 328
See application file for complete search history.

(56) References Cited

U.S. PATENT DOCUMENTS 6,285,114 B1 * 9/2001 Sawin .................... 310/313 R

FOREIGN PATENT DOCUMENTS

DE 19844742 9/1998
DE 10229494 7/2002

* cited by examiner

*Primary Examiner*—Thomas M. Dougherty
(74) *Attorney, Agent, or Firm*—Baker Botts L.L.P.

(57) ABSTRACT

A method is described for improving the long-term stability of a piezoelectric actuator encased in a potting compound containing or forming hydrogen atoms. Oxygen is contained in the piezoelectric actuator's piezoelectric ceramic. Appropriate means are employed so that unsaturated bonds of the hydrogen in the potting compound will release less oxygen from the piezoelectric ceramic. One means consists in reducing the concentration of hydrogen in the potting compound, with appropriate thermal processes as a result of which the concentration of hydrogen will be reduced to below a predefined threshold being applied after the piezoelectric actuator has been encased in the potting compound. Means that form bonds with the hydrogen in the potting compound or duct oxygen thereto are provided in further embodiments.

14 Claims, 2 Drawing Sheets

METHOD FOR IMPROVING THE LONG-TERM STABILITY OF A PIEZOELECTRIC ACTUATOR AND A PIEZOELECTRIC ACTUATOR

CROSS-REFERENCE TO RELATED APPLICATIONS

Technical Field

The invention relates to a method for improving the long-term stability of a piezoelectric actuator.

BACKGROUND

Piezoelectric actuators are employed across very wide-ranging areas of technology for enabling a controlling element to be operated with speed and precision. A preferred application for piezoelectric actuators in motor-vehicle engineering, for example, is in an injection valve in which the piezoelectric actuator controls the injection process, with use preferably being made therein of the piezoelectric actuator's swift dynamic response and fast controllability.

Piezoelectric actuators have at least one piezoelectric element located between two electrodes. The piezoelectric element's thickness is changed through the application of a voltage to said two electrodes, thereby enabling a controlling element to be operated. Since, however, the piezoelectric actuator's lengthening or shortening as a function of the applied voltage is relatively small, a stack comprising a multiplicity of piezoelectric elements each located between two electrodes is used as the piezoelectric actuator for injection valves. Said electrodes are advantageously connected electrically conductively to two contact pins by means of wires. The stack, wires, and contact pins are placed into, for example, a corresponding recess of a cylindrical plastic housing and said recess then filled with a potting compound. The stack is thus encased in the potting compound and protected from environmental influences. The electrodes, spaced a small distance apart, are moreover electrically insulated. Secure fixing of the stack in the plastic housing is furthermore achieved thereby. The potting compound consists of, for example, silicon.

Corresponding piezoelectric actuators are known from, for example, patent application DE 102 29 494 A1 and patent specification DE 198 44 742 C1.

SUMMARY

The object of the invention is to disclose a method and a piezoelectric actuator exhibiting increased long-term stability.

An advantage of the invention is that the chemical reaction occurring between the reductive substance in the potting compound and the piezoelectric ceramic will be reduced or even avoided.

In a further embodiment, an advantage of the method according to the invention is that the frequency of reaction between the oxygen in the ceramic and a reductive substance in the potting compound will be reduced. Trials have shown that potting compounds in use create a reductive atmosphere that will react with the oxygen in the ceramic and release the oxygen therefrom. When a potting compound containing, for instance, hydrogen is used, not all the hydrogen atoms will be completely bound but will have free bonds. The hydrogen will attempt to establish chemical bonds, to achieve which the oxygen in the piezoelectric ceramic will offer itself. Oxygen vacancy conduction will increase owing to the chemical removal of the oxygen atoms bound in the piezoceramic. The electrical conductivity of the piezoelectric ceramic will consequently be increased. This will in turn lead to mechanical fissures and electrical voltage flashovers between the electrodes of the piezoelectric elements. The piezoelectric actuator's long-term stability will hence overall be reduced. The frequency of reaction of the reductive substance, for example of the hydrogen in the potting compound with the oxygen in the piezoelectric ceramic, will be reduced through the measures according to the invention. The quality of the piezoelectric actuator will in this way be enhanced.

In a preferred embodiment of the method a potting compound is used containing a chemically reductive substance having only a predefined maximum concentration. A potting compound is preferably used containing, as the reductive substance, hydrogen in the form of hydrosilicon, with, however, the concentration of hydrosilicon being less than 1 percent in weight. The frequency of reaction between the oxygen in the piezoelectric ceramic and the hydrogen will be substantially reduced owing to the low concentration of hydrosilicon and hence low concentration of hydrogen. Hydrosilicon functions as a bonding agent in the potting compound so that the adhesiveness between the surface of the piezoelectric ceramic and the potting compound used, having, for example, silicon, will be increased. A certain minimum amount of hydrosilicon is necessary to ensure adequate bonding between the surface of the piezoelectric ceramic and the silicon. A surplus of hydrosilicon will, however, result in there being hydrogen having chemically free bonds in the potting compound. The bonding agent being deposited on the surface of the ceramic, there is a risk that the hydrogen's unsaturated bonds will form chemical bonds with the oxygen in the piezoelectric ceramic. The process of releasing oxygen from the piezoelectric ceramic will be moderated through the reduction in the concentration of hydrogen atoms and, in particular, through the reduction in the concentration of hydrosilicon.

In a further embodiment of the method the concentration of the reductive substance and/or of the reaction partners forming said reductive substance will be reduced in the potting compound by means of a thermal process applied after encasing of the piezoelectric actuator in the potting compound. The amount of reductive substance available for reacting with the oxygen in the piezoelectric ceramic will be reduced thereby. As a result, fewer oxygen atoms in the piezoelectric ceramic will be able to establish chemical bonds with the reductive substance in the potting compound.

The concentration of the reductive substance, in particular hydrogen, will preferably be reduced by means of the thermal process to below a predefined threshold. A predefined quality of the piezoelectric actuator will be set thereby that results in enhanced long-term stability.

In a further preferred embodiment the piezoelectric actuator is installed in a housing, in particular a housing of an injection valve, in which are provided means for ducting oxygen to the potting compound. The frequency of reaction of the unsaturated bonds of the reductive substance, in particular of the hydrogen in the potting compound with the oxygen in the piezoelectric ceramic, will be reduced through offering free oxygen. A membrane can moreover be used for feeding oxygen into the housing.

In a further preferred embodiment the housing has means for removing the reductive substance, in particular hydrogen. Said means can be embodied in the form of, for example, a membrane enabling the reductive substance to escape from the housing.

In a further embodiment of the method a second substance avid to establish bonds with the reductive substance in the potting compound is provided in the housing. The free bonds of the reductive substance in the potting compound will be occupied in this manner, also, thus preventing the reductive substance from reacting with the oxygen in the piezoelectric ceramic.

BRIEF DESCRIPTION OF THE DRAWINGS

The invention is explained in more detail below with the aid of the Figures.

DETAILED DESCRIPTION

Figure 1:
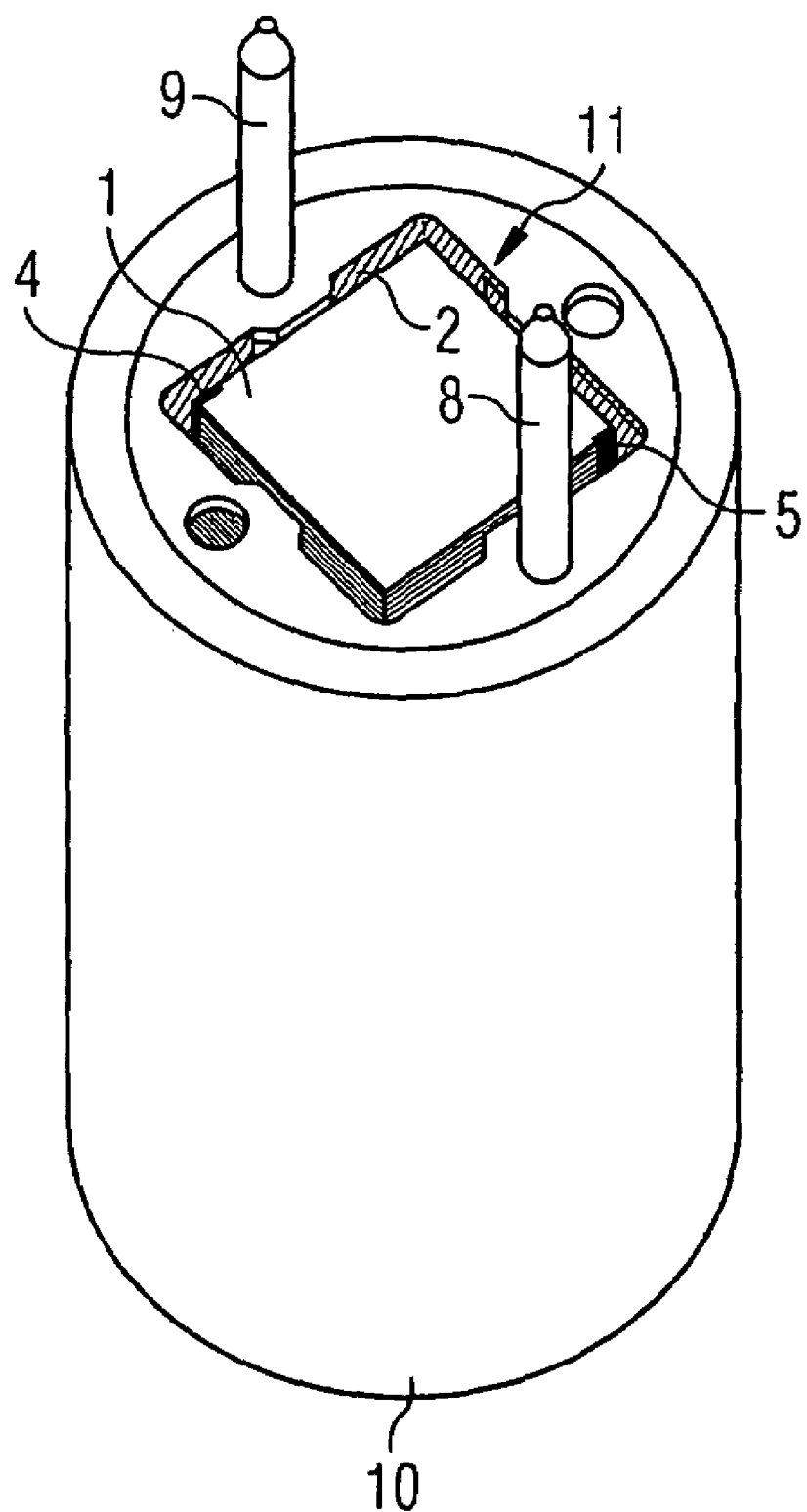
FIG. 1 is a schematic of a piezoelectric actuator secured in position in a plastic casing by means of a potting compound.

FIG. 1 is a perspective view of piezoelectric actuator 1 consisting of a stack of piezoelectric elements, with each piezoelectric element being located between two electrodes. Said electrodes are ducted alternately to a first or second conductor strip 4, 5 located in opposite corner areas of the square-shaped piezoelectric actuator 1. The first and second conductor strip 4, 5 are connected via conductor foils to contact pins 8, 9. The first contact pin 8 is in this way connected electrically conductively to a first half of the electrodes 3. The second contact pin 9 is connected electrically conductively to the other half of the electrodes 3. The preassembled piezoelectric actuator 1 with the conductor foils and the contact pins 8, 9 is inserted into a plastic casing 10 having a corresponding recess 11. Said recess 11 is then filled with a potting compound 2 so that secure fixing of the piezoelectric actuator 1 in the plastic casing 10 is achieved. The potting compound 2 consists of, for example, silicon. The piezoelectric elements consist of a piezoelectric ceramic containing oxygen.

The potting compound 2 is employed to hermetically encase the piezoelectric actuator 1 so that neither moisture nor fuel nor oil will be able to penetrate to the piezoelectric elements. Said potting compound 2 serves also to electrically insulate the electrodes and to dissipate heat. Depending on the specific embodiment employed, the plastic casing 10 can also be dispensed with.

A potting compound 2 is preferably used containing a chemically reductive substance avid to establish chemical bonds with the oxygen in the piezoelectric ceramic. A potting compound is used, for example, that forms a reductive substance. A reductive gas atmosphere can be formed by, for example, curing the potting compound or through secondary reactions thereof. A potting compound containing a bonding agent in the form of hydrosilicon and hence containing hydrogen is used, for example. The concentration of hydrosilicon is preferably less that 1 percent in weight. The potting compound 2 thus contains relatively little hydrogen so that the frequency of reaction between the oxygen in the piezoelectric elements and the hydrogen in the potting compound 11 will be reduced. It is, however, also possible to use potting compounds 2 having other reductive substances whose concentration is kept correspondingly low.

As low as possible a concentration of hydrogen is used depending on the potting compound used. If a bonding agent is used in the potting compound 11, concentrations preferably of between 0.5 and 0.25 percent in the weight of said bonding agent are used. Said concentrations are also preferably used when hydrosilicon is used as the bonding agent.

In a further advantageous embodiment a thermal process at a raised temperature is applied after the piezoelectric actuator 1 has been encased in the plastic casing 10. Said thermal process preferably continues being applied until there is only a predefined concentration of the reductive substance, in this case hydrogen, in the potting compound. In a further embodiment the concentration of the reaction partners forming the reductive substance can also be reduced through the thermal process. The concentration of hydrogen requiring to be set is previously determined experimentally. Temperatures above 120° C. are employed in applying the thermal process. The pressure is preferably reduced during the thermal process to values of down to 2–3 mbar. Use of a low-pressure chamber in which the potted piezoelectric actuator 1 is located is suitable for applying the thermal process.

In a further preferred embodiment the potting compound has a second substance that establishes chemical bonds with the reductive substance in the potting compound. The second substance preferably contains oxygen for a reaction with unsaturated bonds of the reductive substance, in particular with hydrogen in the potting compound.

Figure 2:
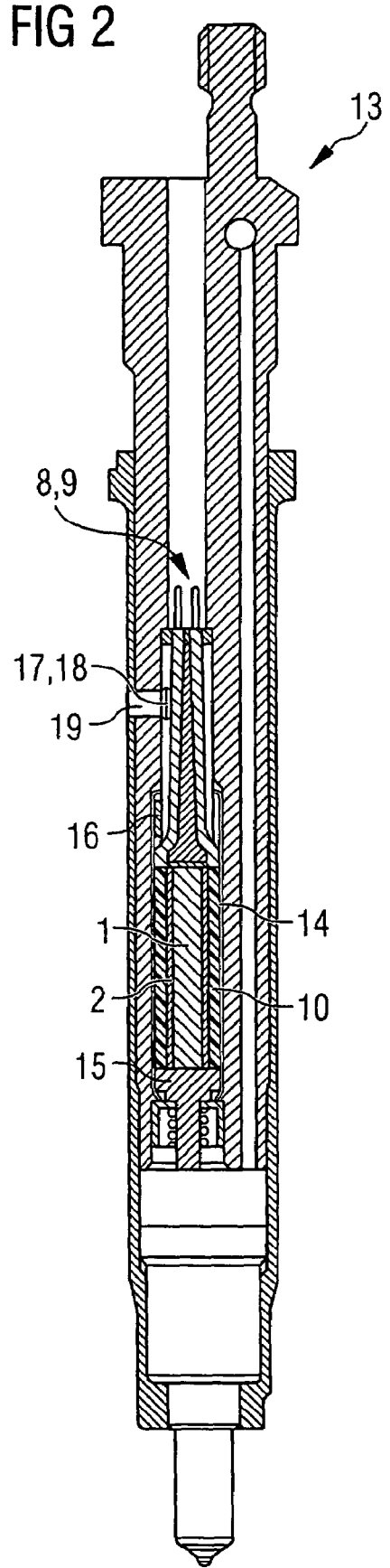
FIG. 2 is a partial view of an injection valve having a housing in which the piezoelectric actuator has been installed.

FIG. 2 is a partial view of an injection valve 13 having a housing 14 in which the piezoelectric actuator 1 in the plastic casing 10 is installed and mechanically linked to a controlling element 15. The position of the controlling element 15 will be changed by the piezoelectric actuator 1 as a function of the current applied to said piezoelectric actuator 1. The controlling element 15 can be embodied in the form of, for example, a servovalve or injection needle. The second substance 16 which makes, for example, oxygen available for a reaction with unsaturated bonds of the hydrogen in the potting compound 2 is preferably located in the housing.

In a further preferred embodiment the housing 14 has an opening 17 in which a membrane 18 is located. The opening 17 is connected to a channel 19. The membrane 18 has, in a first embodiment, the property of allowing the reductive substance, in particular hydrogen, to escape from the housing 14. In a second embodiment the membrane 18 has the property of allowing a reducible substance, in particular oxygen, to penetrate the housing 14 from the channel 19. As a function of the surroundings of the housing 14 the membrane 18 is embodied as being pervious to gas, oil-tight, and water-tight. Oxygen can in this way be ducted into the housing 14 without the ingress of oil or moisture into the housing 14.

The amount of oxygen released from the piezoelectric ceramic will be reduced by the inventive disclosure so that the piezoelectric actuator's long-term stability will be increased.

The invention claimed is:

1. A method for improving the long-term stability of a piezoelectric actuator encased in a potting compound, with said potting compound containing or forming a chemically reductive substance, in particular hydrogen, and being applied against the surface of said piezoelectric actuator, with said piezoelectric actuator consisting of a piezoelectric ceramic containing oxygen, wherein means are employed by which reciprocal action between the potting compound or reductive substance and the oxygen in the ceramic is impeded or prevented.

2. A method according to claim 1, wherein hydrogen is provided as the reductive substance in the potting compound and the means employed will reduce the frequency of reaction between the hydrogen in the potting compound and the oxygen in the ceramic.

3. A method according to claim 2, wherein a potting compound is used having a bonding agent, in particular hydrosilicon, said bonding agent has or forms a reductive substance, and said bonding agent's concentration is less than 1 percent in weight.

4. A method according to claim 1, wherein the concentration of the reductive substance and/or the reaction partners forming the reductive substance in the potting compound is reduced by means of a thermal process applied at a raised temperature.

5. A method according to claim 4, wherein the thermal process is applied in such a way that the concentration of the reductive substance, in particular hydrogen, will fall to below a predefined threshold.

6. A method according to claim 1, wherein the actuators is installed in a housing and said housing has means for ducting oxygen to the potting compound.

7. A method according to claim 1, wherein the actuator is installed in a housing and said housing has means for dissipating the reductive substance released from the potting compound.

8. A method according to claim 1, wherein the actuator is installed in a housing and said housing contains a substance avid to establish bonds with the chemically reductive substance in the potting compound.

9. A piezoelectric actuator having a piezoelectric ceramic encased in a potting compound, with said potting compound containing a chemically reductive substance, in particular hydrogen, with the concentration of said reductive substance in said potting compound being below a predefined threshold value.

10. A piezoelectric actuator according to claim 9, wherein said actuator is installed in a housing and a substance is provided in said housing that will reduce the avidity between the reductive substance and the oxygen contained in the ceramic.

11. A piezoelectric actuator according to claim 9, wherein the housing has means for ducting substances that establish chemical bonds with the reductive substance in the potting compound.

12. A piezoelectric actuator according to claim 9, wherein means for removing the reductive substance from the housing and/or means for ducting substances that establish chemical bonds with the reductive substance in the potting compound are provided.

13. A piezoelectric actuator having a piezoelectric ceramic encased in a potting compound, with the reductive substance, in particular hydrogen, given off by said potting compound being externally dissipatable by means.

14. A piezoelectric actuator according to claim 11, wherein the means are embodied as a membrane in the housing through which membrane the corresponding substances are able to escape and/or be ducted.

* * * * *